United States Patent
Chun et al.

(10) Patent No.: US 6,967,595 B2
(45) Date of Patent: Nov. 22, 2005

(54) INPUT METHOD OF ENCODER SIGNALS

(75) Inventors: Jin-Uk Chun, Gimhae (KR); Jae-Ho Son, Changwon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/946,312

(22) Filed: Sep. 22, 2004

(65) Prior Publication Data

US 2005/0068200 A1 Mar. 31, 2005

(30) Foreign Application Priority Data

Sep. 26, 2003 (KR) ...................... 10-2003-0067024
Sep. 29, 2003 (KR) ...................... 10-2003-0067584

(51) Int. Cl.[7] .............................................. H03M 1/22
(52) U.S. Cl. .......................................................... 341/6
(58) Field of Search .................................. 341/1, 11, 6

(56) References Cited

U.S. PATENT DOCUMENTS

| | | | | |
|---|---|---|---|---|
| 4,427,970 | A | * | 1/1984 | Devol ............................ 341/6 |
| 5,321,638 | A | * | 6/1994 | Witney ........................ 702/104 |
| 6,357,244 | B1 | * | 3/2002 | Mori ............................ 62/231 |
| 6,679,071 | B1 | * | 1/2004 | Storey et al. ................. 62/126 |

* cited by examiner

Primary Examiner—Peguy JeanPierre
(74) Attorney, Agent, or Firm—Fleshner & Kim, LLP

(57) ABSTRACT

The present invention relates to an input method of encoder signals, and more particularly, to an input method of encoder signals which senses encoder signals by setting a predetermined signal sensing period at which the encoder signals to be input are sensed, and adjusts sensitivity according to the input of the encoder signals by using input period and number of times of the encoder signal. In the present invention, an output period of interrupt signals output from a microcontroller is set to be shorter than an output period of the encoder signals. In addition, for the control according to the operation of the encoder, the microcontroller determines an input period of the encoder signals and then determines whether the encoder signals are input continuously or discontinuously. If the encoder signals are continuously input, the sensitivity of the encoder signals is adjusted in order to select the next item in the initial state by counting the input number of times of the encoder signals. According to the present invention as described above, the microcontroller cannot omit any one of the encoder signals for the interrupt period. In addition, according to the present invention, it is possible to precisely select the desired item by adjusting the sensitivity according to the input of the encoder signals.

8 Claims, 4 Drawing Sheets

| Rotational Direction | Terminal | Signal |
|---|---|---|
| Clockwise (Right) | Terminal A | OFF/ON: 1 0 0 1 |
| | Terminal B | OFF/ON: 1 1 0 0 |
| Counterclockwise (Left) | Terminal A | OFF/ON: 1 1 0 0 |
| | Terminal B | OFF/ON: 1 0 0 1 |

T1 T2 T3 T4

Recognition of encoder signals

Interrupt period (1.024ms) of microcontroller

S

Microcontroller cannot recognize encoder signals if data are lost at period of 600 to 700μs

INPUT METHOD OF ENCODER SIGNALS

BACKGROUND OF THE INVENTION

1. Field of Invention

The present invention relates to an input method of encoder signals, and more particularly, to an input method of encoder signals which senses encoder signals by setting a predetermined signal sensing period at which the input encoder signals are sensed, and adjusts sensitivity according to the input of the encoder signals by using input period and number of times of the encoder signal.

2. Description of the Prior Art

Hereinafter, an input method of encoder signals according to a prior art will be described.

FIG. 1 is a diagram illustrating a circuit for inputting the encoder signals according to the prior art.

First, upon review of connectional relationship of the circuit, an encoder 20 having two contacts A and B is provided, and the respective contacts A and B of the encoder 20 are connected to the microcontroller 10. A first resistance is connected between the contact A of the encoder 20 and the microcontroller 10. In addition, a second resistance is connected between the contact B of the encoder 20 and the microcontroller 10.

In order to select one of set items, a user operates the encoder 20. Accordingly, as the contacts of the encoder 20 are closed and opened, the relevant signals are input to the microcontroller 10. Then, the microcontroller 10 determines the item selected by the user and allows control for the corresponding item to be performed.

FIG. 2 is a view showing the related art encoder. FIG. 3 is a diagram showing a state according to the input method of the encoder signals according to the prior art.

As an embodiment of the prior art, the encoder of FIG. 2 is mounted on a display of a kimchi refrigerator. In the prior art, the items, such as the kind of kimchi and a storage temperature, are set so that they may be selected according to the rotation of the encoder provided in the kimchi refrigerator.

Therefore, in order to select one of the set items, the user operates the encoder 20. To this end, as shown in FIG. 2, the encoder 20 is provided. Then, by rotating the encoder 20, the items corresponding to positions of the encoder 20 are selected.

That is, by rotating the encoder 20 clockwise and counterclockwise, it becomes possible to select one of the different items from each other. At two terminals of the contacts A and B of the encoder 20, signals '11', '01', '00', and '10' are generated when the encoder 20 rotates to the right side, i.e. in a clockwise direction, and signals '11', '10', '00', and '01' are generated when the encoder 20 rotates to the left side, i.e. in a counterclockwise direction. As the signals are transmitted to the microcontroller 10, the microcontroller 10 senses the transmitted signals and recognizes the rotation of the encoder 20. Then, the microcontroller 10 controls the operation of the kimchi refrigerator by understanding the control signals corresponding to the rotation of the encoder 20.

That is, when the encoder 20 rotates clockwise, the contact A of the encoder 20 is turned ON/OFF as shown in FIG. 3. Such connection states, ON/OFF, in the contact A of the encoder 20 are transmitted to the microcontroller 10, and the microcontroller 10 catches hold of the states of the encoder 20.

In addition, when the encoder 20 rotates clockwise, the contact B of the encoder 20 is also turned ON/OFF as shown in FIG. 3. Such connection states, ON/OFF, in the contact B of the encoder 20 are also transmitted to the microcontroller 10, and the microcontroller 10 catches hold of the states of the encoder 20. Here, '1' (high signal) is input to the microcontroller 10 when the contact A or B of the encoder 20 is OFF, and '0' (low signal) is input to the microcontroller 10 when the contact A or B of the encoder 20 is ON.

That is, the signals according to the connection states are divided into '11' when the contacts A and B of the encoder 20 are OFF, '01' when the contact A is ON and the contact B is OFF, '00' when the contacts A and B of the encoder 20 are ON, and '10' when the contact A is OFF and the contact B is ON.

In the meantime, when the encoder 20 rotates counterclockwise, the contact A of the encoder 20 is turned ON/OFF as shown in FIG. 3. Such connection states, ON/OFF, in the contact A of the encoder 20 are transmitted to the microcontroller 10, and the microcontroller 10 catches hold of the state of the encoder 20.

In addition, when the encoder 20 rotates counterclockwise, the contact B of the encoder 20 is turned ON/OFF as shown in FIG. 3. Such connection states, ON/OFF, in the contact B of the encoder 20 are transmitted to the microcontroller 10, and the microcontroller 10 catches hold of the state of the encoder 20. Here, '1' (high signal) is input to the microcontroller 10 when the contact A or B of the encoder 20 is OFF, and '0' (low signal) is input to the microcontroller 10 when the contact A or B of the encoder 20 is ON.

That is, the signals according to the connection states are divided into '11' when the contacts A and B of the encoder 20 are OFF, '10' when the contact A is OFF and the contact B is ON, '00' when the contacts A and B of the encoder 20 are ON, and '01' when the contact A is ON and the contact B is OFF.

After the control signals divided as above are transmitted to the microcontroller 10, the microcontroller 10 recognizes the corresponding item according to the transmitted signals and performs the control of the corresponding item.

FIG. 4 is a view showing a signal output state of the encoder according to the prior art.

As the example of the prior art, the encoder 20 is mounted on the display of the kimchi refrigerator. In the prior art, the items, such as the kind of kimchi and the storage temperature, are set so that they may be selected according to the rotation of the encoder 20 provided in the kimchi refrigerator. Therefore, in order to select one of the set items, the user operates the encoder 20. After the signals for the corresponding item selected by operating the encoder 20 are transmitted to the microcontroller 10, the microcontroller 10 recognizes the corresponding signals and controls the operation of the kimchi refrigerator.

That is, in the prior art as shown in the figures, according to the rotation of a dial connected to the encoder 20, the signals caused from the connection states of the contacts of the encoder 20 are transmitted to the microcontroller 10. As shown in FIG. 3, for example, if the encoder 20 rotates clockwise, the signals are output from the contacts A and B of the encoder. Therefore, if the encoder 20 rotates a first quarter of revolution, the microcontroller 10 recognizes the corresponding signal '11' for a period of time T1. Then, if the encoder 20 rotates a second quarter of revolution, the microcontroller 10 recognizes the corresponding signal '01' for a period of time T2. Further, if the encoder 20 rotates a third quarter of revolution, the microcontroller 10 recognizes the corresponding signal '00' for a period of time T3. Furthermore, if the encoder 20 rotates a fourth quarter of revolution, the microcontroller 10 recognizes the corresponding signal '10' for a period of time T4. Here, in the case that the encoder 20 rotates one revolution in order of T1, T2, T3, and T4, a minimum period of time is about 600 to 700 µs.

However, when recognizing the rotation of the encoder as above, as shown in FIG. 4, the microcontroller reads data every 1.024 ms. Therefore, the microcontroller cannot recognize about two or three out of ten signals of the encoder.

In the prior art as above, there is a limitation to precise adjustment of the rotation sensitivity of the encoder as the user rotates the encoder by hand. That is, since the user should precisely rotate the dial in order to select a desired item with the encoder, it is difficult to operate the encoder.

Furthermore, while sensing the encoder signals in the prior art, data for a predetermined period of the encoder signals are often lost since the period of the interrupt signals of the microcontroller is longer than the period of the encoder signals. Therefore, the prior art has a limitation to the normal recognition of the rotation of the encoder.

SUMMARY OF THE INVENTION

Accordingly, an object of the present invention is to provide an input method of encoder signals, which selects an item according to the encoder signals using input period and input number of times of the encoder signals.

Another object of the present invention is to provide an input method of encoder signals which senses the encoder signals in order not to omit the input encoder signals.

According to an aspect of the present invention for achieving the objects, there is provided an input method of encoder signals, comprising a signal period determining step of determining an input period of signals at which the signals caused from operation of the encoder are input to a microcontroller; a first control step of performing a control for selecting a first corresponding item according to the input signals if the encoder signals are input into the microcontroller within a predetermined period; a signal counting step of counting an input number of times of the encoder signals for the input period of the signals if the encoder signals are input into the microcontroller at over the predetermined period; and a second control step of controlling a control for selecting a second corresponding item if the input number of times counted in the signal counting step reaches a predetermined number of times.

The input method of the encoder signals according to the present invention may further comprise the step of initializing an input number of times and the input period of the encoder signals after performing the first or second control steps.

According to the present invention, a reference value of the input period of the signals determined in the signal period determining step may be 100 ms.

Preferably, if the input period of the signals is over 100 ms, the microcontroller determines that the signals are discontinuously input.

More preferably, the predetermined number of times counted in the signal counting step is three.

The input method of the encoder signals according to the present invention may further comprise the steps of setting a output period of interrupt signals of the microcontroller to be shorter than an output period of the encoder signals, and sensing the output period of the encoder signals if the signals are output from the encoder.

Preferably, the output period of the encoder signals is 600 to 700 µs.

More preferably, the output period of the interrupt signals is 512 µs.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE PREFERRED EMBODIMENT

Figure 1:
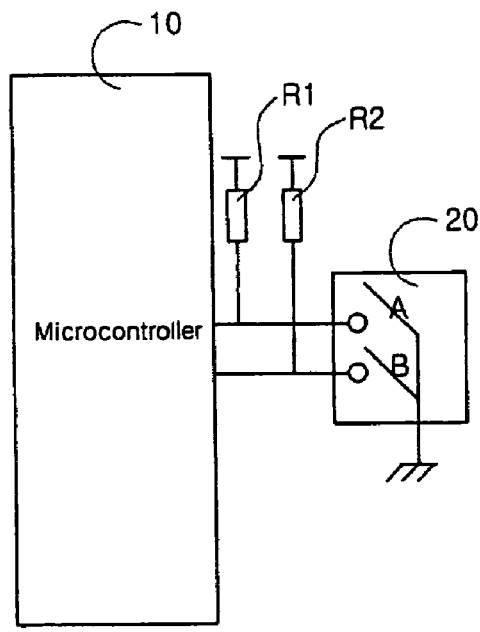
FIG. 1 is a diagram illustrating a circuit for inputting encoder signals according to a prior art.
Figure 2:
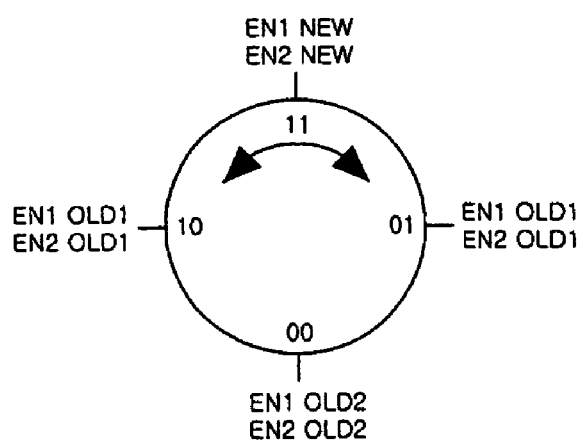
FIG. 2 is a view showing an encoder according to the prior art.
Figures 3, 4:
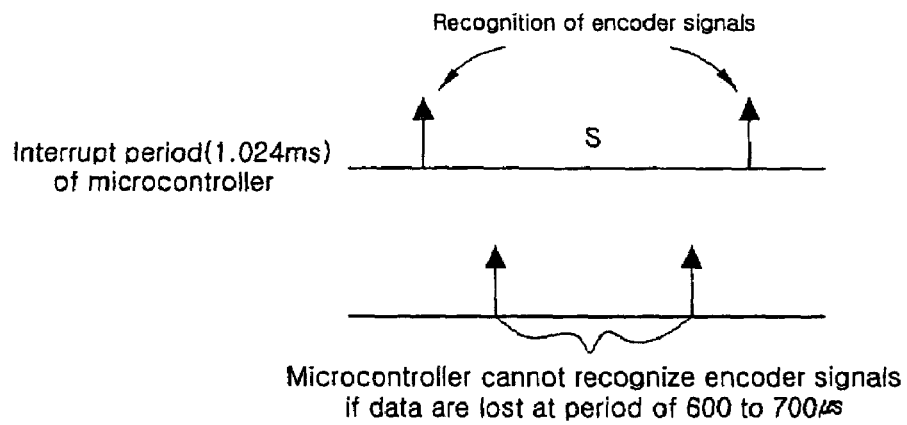
FIG. 3 is a diagram showing the states according to an input method of encoder signals according to the prior art.
FIG. 4 is a view showing a signal output state of the encoder according to the prior art.

Hereinafter, an input method of encoder signals according to the present invention will be described in detail with reference to FIG. 1.

Figure 5:
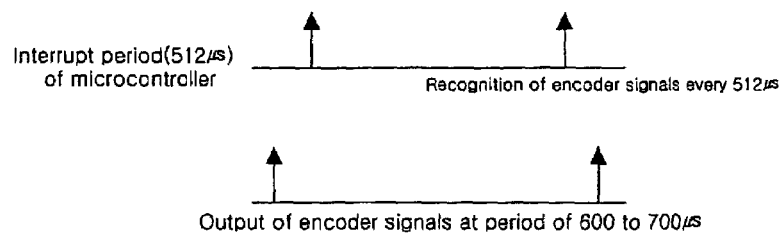
FIG. 5 is a view showing a state where a signal is output from an encoder according to the present invention.

FIG. 5 is a view showing a state where a signal is output from an encoder according to the present invention.

Upon review of an embodiment of the present invention where a kimchi refrigerator is mounted with an encoder 20, the items, such as the kind of kimchi and a storage temperature, are set so that they may be selected according to the rotation of the encoder 20. Accordingly, if the encoder 20 rotates, signals according to the rotation of the encoder 20 are transmitted to a microcontroller 10. Then, the microcontroller 10 recognizes the item selected by the rotation of the encoder 20 and determines the operational condition of the kimchi refrigerator. The microcontroller 20 controls the operation of the kimchi refrigerator according to the determined condition, such as the kind of kimchi or the storage temperature.

To this end, when the microcontroller 10 senses the encoder signals every interrupt period, the present invention sets a predetermined sensing period of the encoder signals. Here, as the sensing period of the encoder signals, a period of interrupt signals is set to 512 µs. Therefore, the encoder signals are sensed every 512 µs, which is shorter than 1.024 ms of the prior art.

As shown in FIG. 5, therefore, the interrupt period of the microcontroller 10 is smaller than the period of the encoder signals. Accordingly, it is possible to sense all of the encoder signals. That is, however shorter the period (e.g., 600 to 700 µs) of the encoder signals input to the microcontroller 10 may be, the interrupt period of the microcontroller 10 is included within the period of the encoder signals. Therefore, according to the present invention, the microcontroller can recognize all of the encoder signals without omission of any one of the encoder signals.

Figure 6:
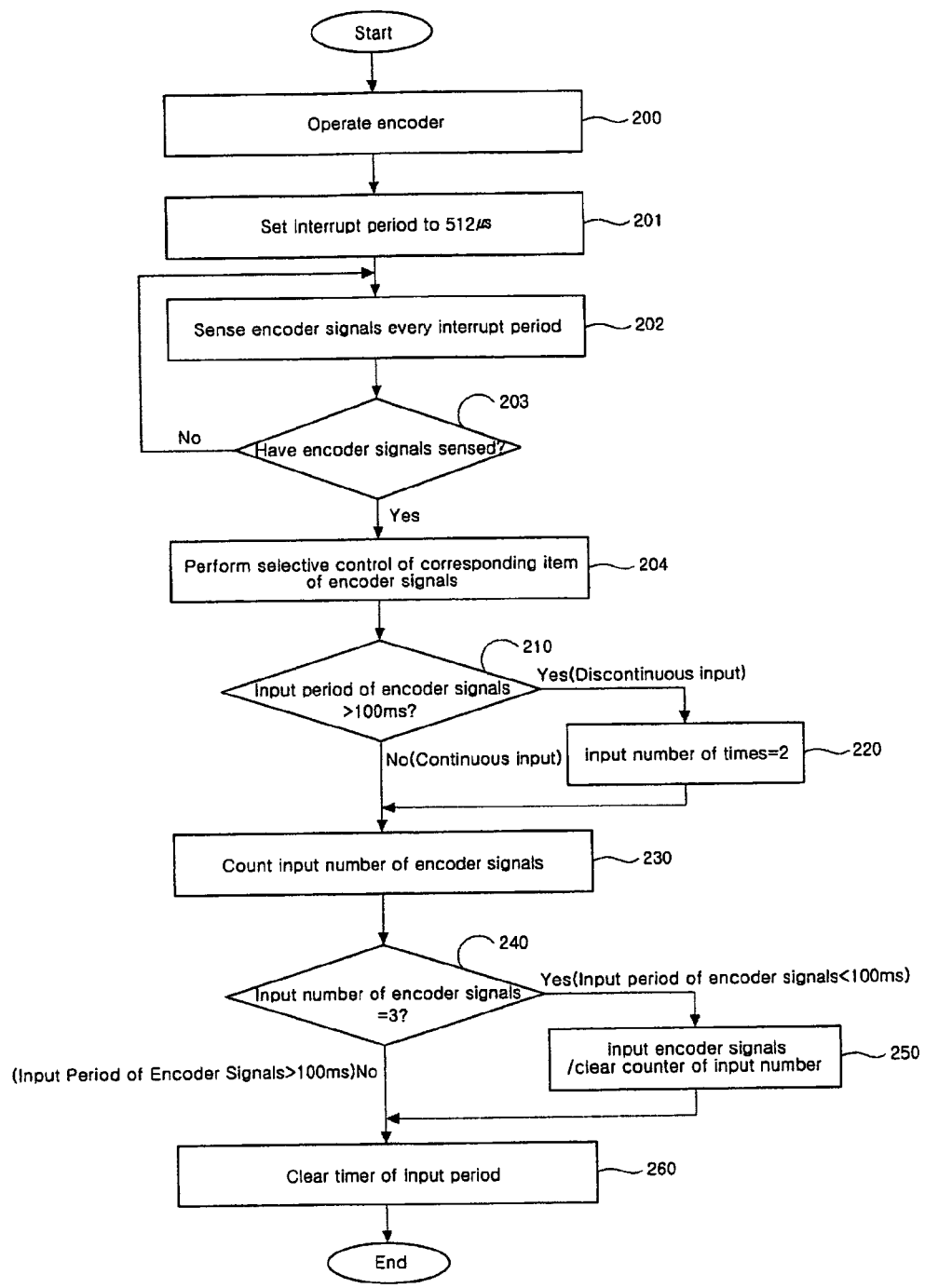
FIG. 6 is a flowchart of an operating control for adjusting the sensitivity of input of encoder signals by sensing the encoder signals input through the encoder according to the present invention.

FIG. 6 is a flowchart of an operating control for adjusting the sensitivity of the input of the encoder signals by sensing the encoder signals input through the encoder according to the present invention.

Upon review of the embodiment wherein the kimchi refrigerator is mounted with the encoder 20, the items, such as the kind and temperature of kimchi, are set so that they may be selected according to the rotation of the encoder 20. Accordingly, if the encoder 20 rotates, the signals according to the rotation of the encoder 20 are transmitted to the microcontroller 10, and the microcontroller 10 recognizes the item selected according to the rotation of the encoder 20 and determines the operational condition of the kimchi refrigerator. Then, the microcontroller 10 controls the operation of the kimchi refrigerator according to the determined item, such as the kind of kimchi or the temperature.

Therefore, in order to select the item for operating the kimchi refrigerator, if a user rotates the encoder 20 (step 200), the signals according to the rotation of the encoder 20 are transmitted to the microcontroller 10. Then, the microcontroller 10 recognizes the item selected according to the rotation of the encoder 20 and determines the operational condition of the kimchi refrigerator. Then, the microcontroller 10 controls the operation of the kimchi refrigerator according to the determined operational condition, such as the kind of kimchi or the temperature.

To this end, the present invention sets the predetermined sensing period of the encoder signals when the microcontroller 10 senses the encoder signals every interrupt period. Here, as the sensing period of the encoder signals, the period of the interrupt signals is set to 512 $\mu$s. Therefore, the encoder signals are sensed every 512 its, which is shorter than 1.024 ms of the prior art.

Therefore, as shown in the figure, since the interrupt period of the microcontroller 10 is smaller than the period of the encoder signals, it is possible to sense all of the encoder signals. That is, however shorter the period (e.g., 600 to 700 $\mu$s) of the encoder signals input to the microcontroller 10 may be, the interrupt period of the microcontroller 10 is included within the period of the encoder signals. Therefore, according to the present invention, the microcontroller 10 can recognize all of the encoder signals without omission of any one of the encoder signals.

In the present invention, the interrupt period of the microcontroller 10 is set to 512 $\mu$s, which is shorter than that of the encoder signals (step 201).

Then, if the user operates the encoder 20 mounted to the kimchi refrigerator, the encoder signals are output to the microcontroller 10. Here, the microcontroller 10 senses the encoder signals every interrupt period previously set to 512 $\mu$s (step 202). At this time, since the interrupt period is formed within the period (600 to 700 $\mu$s) of the encoder signal, it is possible to sense all of the encoder signals without omission of any one of the encoder signals.

As a result, when the microcontroller 10 senses the encoder signals (step 203), the microcontroller 10 selects the item corresponding to the encoder signals and controls the operation of the kimchi refrigerator (step 204).

After the input of the encoder signals is sensed through the steps 201 to 204, an input period of the signals transmitted to the microcontroller 10 is determined according to the rotation of the encoder 20.

If a period of the signals input to the microcontroller 10 is over 100 ms, the microcontroller 10 determines that the encoder signals are discontinuously input. That is, the microcontroller 10 determines that there is the sensitivity of the encoder to a certain extent that the user can sufficiently confirm the corresponding items displayed as the encoder 20 rotates.

When the encoder signals are discontinuously input as above, the input of the encoder signals are immediately transmitted to the microcontroller 10. Then, the microcontroller 10 recognizes the state corresponding to the input of the encoder signals in the existing state and then performs the control for selecting the corresponding item according to the encoder signals (step 220)

After counting the encoder signals of the next state in the existing state as above (step 230), the input period of the encoder signals is initialized (step 260).

However, in the step 210, if the input period of the signals input to the microcontroller 10 is below 100 ms, it is determined that the signals are continuously input. That is, the microcontroller 10 determines that there is the sensitivity of the encoder to a certain extent that the user cannot sufficiently confirm the corresponding item displayed as the encoder 20 rotates.

Since the encoder 20 responses very sensitively, if the user does not carefully operate the encoder 20, the encoder 20 rotates very fast and the items corresponding to the encoder signals progress very fast. Accordingly, it may become difficult for the user to confirm the corresponding items according to the operation of the encoder 20.

Therefore, if it is determined in the step 210 that the input period of the signals of the encoder 20 is below 100 ms, i.e. the encoder signals are continuously input, an input number of times of the encoder signals input to the microcontroller 10 is counted (step 230).

Then, if the input number of the encoder signals counted in the step 230 reaches a predetermined number of times (step 240), the microcontroller 10 receives the encoder signals. The microcontroller 10 performs the control for selecting the corresponding item of the encoder signals continuously input.

If the corresponding item according to the input of the encoder signals is selected as above, the input number of times of the encoder signals counted in the steps 230 and 240 is initialized (step 250). Then, the input period of the encoder signals is also initialized (step 260).

As described above, in order to prevent encoder signals from being omitted, the present invention sets the interrupt period of the microcontroller, and senses the input encoder signals every predetermined interrupt period. At this time, the interrupt period of the microcontroller is formed shorter than an output period of the encoder signals. Therefore, all of the encoder signals generated while the encoder rotates one (1) revolution can be sensed without omission of any one of the encoder signals.

The fundamental technical spirit of the present invention is in that the sensitivity of the encoder may be adjusted by checking the input period of the encoder signals, determining whether the signals are continuously or discontinuously input, and counting the input number of times of the encoder signals.

Therefore, according to the input method of the encoder signals of the present invention, the following advantages can be expected.

The present invention sets the predetermined signal sensing period (interrupt period) for sensing that the encoder signals are applied. In addition, the encoder signals are sensed within the predetermined signal sensing period. At this time, since the predetermined signal sensing period is shorter than the signal period of the encoder, it is possible to sense all of the encoder signals. Therefore, according to the present invention, since it is possible to recognize all of the encoder signals without omission of any one of the encoder signals in any conditions, the effect that the product reliability is improved can be expected.

In addition, according to the present invention, the encoder signals, which are classified into the continuously or discontinuously input signals by using a timer, can be freely input. Further, the input sensitivity of the encoder signals can be correctly understood by counting the input number of times of the encoder signals using a counter. As a result, according to the present invention, it is possible to correctly adjust the sensitivity according to the input of the encoder signals and to correctly select the desired item.

It will be apparent that those skilled in the art can make various modifications and changes thereto within the scope without departing from the technical spirit of the present invention through the above descriptions. Therefore, the technical scope of the present invention is not limited to the embodiment described above but should be defined by the appended claims.

What is claimed is:

1. An input method of encoder signals, comprising:
    a signal period determining step for determining an input period of signals at which the signals caused from operation of the encoder are input to a microcontroller;
    a first control step for performing a control for selecting a first corresponding item according to the input signals if the encoder signals are input into the microcontroller within a predetermined period;
    a signal counting step for counting an input number of times of the encoder signals for the input period of the signals if the encoder signals are input into the microcontroller at over the predetermined period; and
    a second control step for performing a control for selecting a second corresponding item if the input number of times counted in the signal counting step reaches a predetermined number of times.

2. The input method as claimed in claim 1, further comprising the step of initializing an input number of times and the input period of the encoder signals after performing the first or second control steps.

3. The input method as claimed in claim 1, wherein a reference value of the input period of the signals determined in the signal period determining step is 100 ms.

4. The input method as claimed in claim 3, wherein if the input period of the signals is over 100 ms, the microcontroller determines that the signals are discontinuously input.

5. The input method as claimed in claim 1, wherein the predetermined number of times counted in the signal counting step is three.

6. The input method as claimed in claim 1, further comprising the steps of:
    setting a output period of interrupt signals of the microcontroller to be shorter than an output period of the encoder signals; and
    sensing the output period of the encoder signals if the signals are output from the encoder.

7. The input method as claimed in claim 6, wherein the output period of the encoder signals is 600 to 700 $\mu$s.

8. The input method as claimed in claim 6, wherein the output period of the interrupt signals is 512 $\mu$s.

* * * * *